United States Patent [19]

Saito et al.

[11] Patent Number: 5,604,917
[45] Date of Patent: Feb. 18, 1997

[54] IC MEMORY CARD HAVING MASKING FUNCTION FOR PREVENTING WRITING OF DATA INTO A FIXED MEMORY AREA

[75] Inventors: Osamu Saito; Kaoru Adachi, both of Tokyo, Japan

[73] Assignee: Fuji Photo Film Co., Ltd., Kanagawa, Japan

[21] Appl. No.: 294,870

[22] Filed: Aug. 29, 1994

Related U.S. Application Data

[63] Continuation of Ser. No. 752,006, Aug. 29, 1991, abandoned.

[30] Foreign Application Priority Data

Sep. 28, 1990 [JP] Japan ..................... 2-257379

[51] Int. Cl.⁶ .............. G06F 12/16; G06F 12/06
[52] U.S. Cl. .............. 395/869; 395/833; 395/515; 371/22.1; 365/189.01; 365/149
[58] Field of Search .................. 235/492, 380; 365/189.01, 185, 149; 395/425, 869, 165, 166; 371/22.1, 833; 340/537

[56] References Cited

U.S. PATENT DOCUMENTS

| | | | |
|---|---|---|---|
| 4,291,404 | 9/1981 | Steiner | 371/22.1 |
| 4,380,070 | 4/1983 | Steiner | 340/537 |
| 4,617,650 | 10/1986 | Mokino et al. | 365/195 |
| 4,701,886 | 10/1987 | Sakakibara et al. | 371/21.1 |
| 4,727,363 | 2/1988 | Ishii | 345/190 |
| 4,960,982 | 10/1990 | Takahira | 235/382 |
| 5,056,009 | 10/1991 | Mizuta | 395/490 |
| 5,129,060 | 7/1992 | Pfeiffer et al. | 395/166 |
| 5,157,247 | 10/1992 | Takahira | 235/492 |
| 5,168,151 | 12/1992 | Nara | 235/492 |

FOREIGN PATENT DOCUMENTS 0438978  5/1992  European Pat. Off. .

*Primary Examiner*—Tod R. Swann
*Assistant Examiner*—James Peikari

[57] ABSTRACT

An IC memory card includes an input/output unit attachable to or detachable from a host processing apparatus, a storage unit having a semiconductor memory for storing data, and a control unit for performing write control of data transmitted from the host processing apparatus into the storage unit and read control of the data stored in the storage unit, which is to be transferred to the host processing apparatus. In such an IC memory card, the storage unit is provided with a fixed area in which fixed information not to be overwritten has previously been written and with a variable area in which rewritable data and management information for the rewritable data are written. The control unit includes an address detector for detecting if the fixed area of the storage unit is accessed and for generating a detection signal if such an access occurs. A read/write controller is included for providing such a control that when the address detector detects the fact that the fixed area of the storage unit is accessed, a control signal for writing of data supplied from the host processing apparatus is masked by the detection signal so as to inhibit the data from being written into the storage unit.

8 Claims, 2 Drawing Sheets

IC MEMORY CARD HAVING MASKING FUNCTION FOR PREVENTING WRITING OF DATA INTO A FIXED MEMORY AREA

This application is a continuation of application Ser. No. 07/752,006, filed on Aug. 29, 1991, now abandoned.

BACKGROUND OF THE INVENTION

1. Field of the Invention

The present invention relates to an IC memory card for storing data such as image data, character data and so on.

2. Description of the Background Art

Recently, there has become a tendency that a compact IC memory card using a semiconductor memory is used, instead of a floppy disc, as a medium for recording image data for an electronic still camera, or the like, and character data for a word processor, or the like.

In such an IC memory card, there is previously stored fixed information such as nonvolatile information peculiar to the card, including for instance the kind of semiconductor memory used in the card, its memory capacity, its memory speed and so on.

The fixed information is necessary in a case where the IC memory card is read by a host processing apparatus to which it is attached and wherein read/write of data is performed by a control signal adapted for the card.

However, according to the conventional IC memory card, there is provided no distinction between the fixed information and information to be rewritten, and the fixed information is simply stored in a predetermined portion of a storage unit, for instance, a first portion of a storage area. Consequently, if any unusual events occur on the host processing apparatus so that an access for rewriting the fixed information may be produced, there is a possibility that such a storage area will be rewritten with information other than the fixed information. If the fixed information is replaced with other information, such a card will become unusable. Thus, the conventional IC memory card has been associated with such drawback that data stored therein can not be read out.

SUMMARY OF THE INVENTION

It is therefore an object of the present invention to provide an IC memory card capable of protecting the fixed information, even if the fixed information is erroneously accessed.

According to the present invention, there is provided an IC memory card including an input/output unit attachable to or detachable from a host processing apparatus, a storage unit comprising a semiconductor memory for storing data, and a control unit for performing control of writing of data transmitted from the host processing apparatus into the storage unit or reading out of the data stored in the storage unit to the host processing apparatus. In such an IC memory card, the storage unit is provided with a fixed area in which fixed information not to be rewritten over is previously written and a variable area in which rewritable data and management information for the rewritable data are written. The control unit includes an address detector for detecting the fact that the fixed area of the storage unit is accessed and generating a detection signal, and a read/write controller for providing such a control that when the address detector detects the fact that the fixed area of the storage unit is accessed, a control signal for writing of data supplied from the host processing apparatus is masked with the detection signal transmitted from the address detector so as to inhibit the data from being written into the storage unit.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The objects and features of the present invention will become more apparent from consideration of the following detailed description taken in conjunction with the accompanying drawings, which are given by way of illustration only, and thus are not limitative of the present invention and in which.

DESCRIPTION OF THE PREFERRED EMBODIMENT

Referring to the accompanying drawings, further details of the embodiments of an IC memory card will be given hereinafter.

Figure 1:
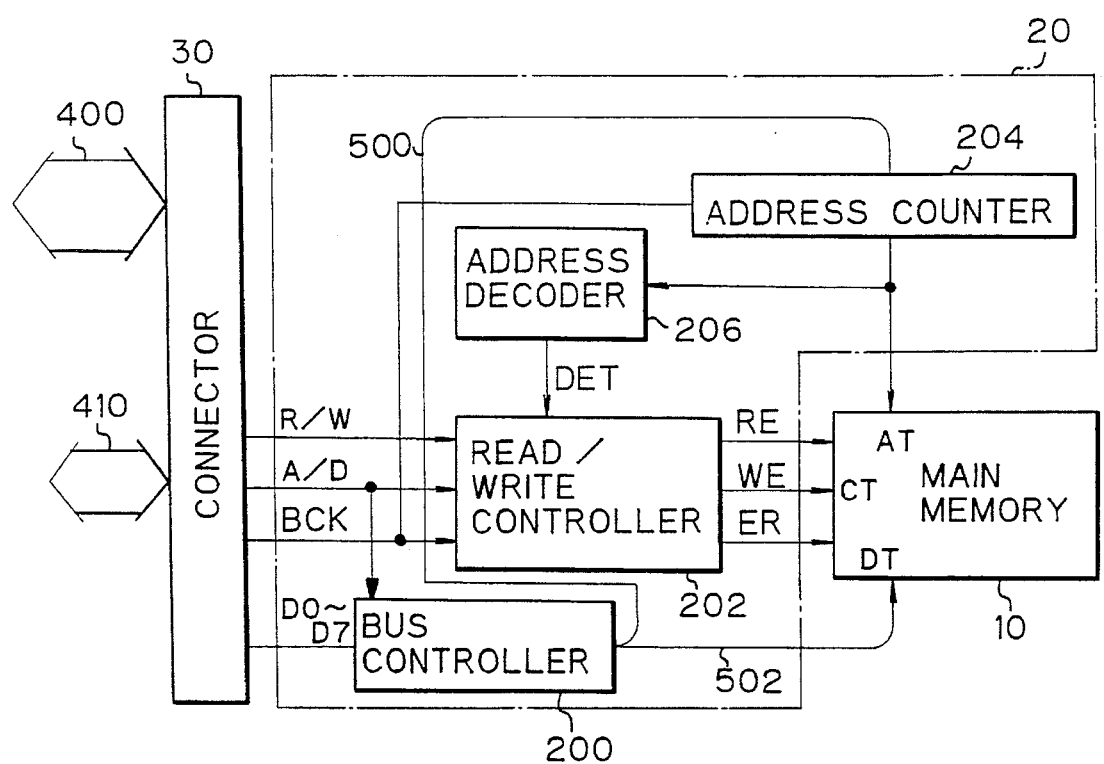
FIG. 1 is a block diagram showing an illustrative embodiment according to the present invention.

The IC memory card comprises, as shown in FIG. 1, a main memory unit 10 for storing data, a control unit 20 for performing read/write control for the main memory unit 10, and an input/output unit or connector 30 attachable to or detachable from a host processing apparatus.

The main memory 10 is constituted with a block erasing type of EEPROM (Electrically erasable and Programmable Read only memory). Erasing of the EEPROM is performed, in the case of the present embodiment for example, in units of storage of image data or in units of cluster. In the main memory 10, the storage area consists of a fixed information area, a card information area and a data area for storing recording data such as image data. In the fixed information area, there has been previously stored fixed information peculiar to the card, for instance the kind of memory which includes that a semiconductor memory used in the main memory unit 10 is constituted by the EEPROM, its memory size, its memory speed such as time required for writing per byte, an erasing time, an access time:, and a name of a maker and so on. The fixed information has been stored in storage areas of the main memory unit 10 beginning from a lead-off address "000000" to for instance an address "0000FF" of a cluster. This information is read out at the time when the card is attached to the host processing apparatus and becomes an indicator for causing the host processing apparatus to transmit a control signal suitable for the use of such a card. If this information is not suitable for the host processing apparatus, the host processing apparatus provides an error indication, so that read and write of data is completely inhibited. In the card information area, there is written information related to recording data such as the kind of recording data, photographing data, start cluster number of recording data, end cluster number, a compression mode, an input device, the number of horizontal pixels and the number of vertical pixels. The card information is written into clusters subsequent to the cluster which stores the fixed information, and may be rewritten every time when data is written. In the data area, there is recorded data. The data area is allotted to the clusters in their entirety after the address in which the card information has been written. The card information area and the data area constitutes variable areas which are accessible at the end of the host processing apparatus. The main memory unit 10 is provided with a plurality of address terminals AT to which address signals for read/write of data are supplied, a plurality of control terminals CT to which control signals for reading, writing and erasing are supplied, respectively, and a plurality of data terminals DT for read/write of data.

The control unit 20 is provided with a bidirectional bus controller 200 adapted to separate address signals and data signals supplied through the connector 30 and transmit the thus separated signals to an address line 500 and a data line 502, respectively, and also to transmit data read out from the main memory 10 through the connector 30 to the host processing apparatus side, a read/write controller 202 for reading control signals supplied through the connector 30 and for transmitting control signals for reading, writing and erasing to the main memory unit 10, an address counter 204 for latching the address signals transferred from the bus controller 200 through the address line 500, and an address decoder 206 for reading the address signals transferred from the address counter 204 to the main memory unit 10 and for transmitting detection signal Det to the read/write controller 202 if the addresses are "000000–0000FF" of the fixed information areas.

The bus controller 200 is a bidirectional control circuit for providing both the control of transfer of the address signals for access of the main memory unit 10 supplied from the host side through the connector 30 to the address counter 204 and transfer of the data signals supplied through the same line as the address signals to the main memory unit 10, and the further control of transfer of the data read out from the main memory unit 10 to the host side.

Figure 2:
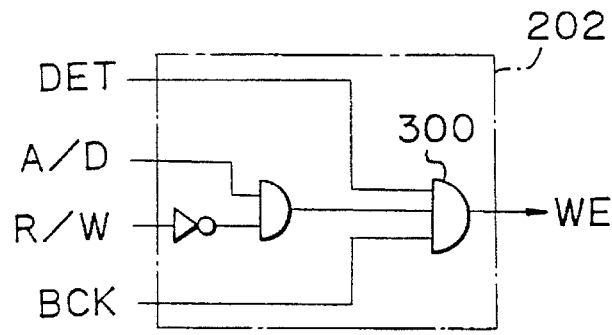
FIG. 2 is a circuit diagram showing a partial structure of the read/write controller in the illustrative embodiment.

The read/write controller 202 is loaded with a read/write identification signal R/W, an address data identification signal A/D and a bus clock BCK, which are supplied through connector 30, and transmits the control signals for reading, writing and erasing to the main memory unit 10. In more detail, if the bus clock BCK is supplied to the read/write controller 202 while the read/write identification signal R/W is supplied with a low level and the address data identification signal A/D is supplied with a high level, an enabling signal WE for data writing is transmitted; if the bus clock BCK is supplied to the read/write controller 202 while the read/write identification signal R/W is supplied with a high level and the address data identification signal A/D is supplied with a high level, an enabling signal RE for data readout is transmitted; and if overwriting occurs on any cluster of the main memory unit 10, the read/write controller 202 supplies an erasing signal ER, upon receipt of an erasing signal from a circuit not illustrated, to the main memory unit 10. Further, according to the present embodiment, the read/write controller 202 is so arranged that upon receipt of a detection signal DET from the address decoder 206 indicative of detection of an address of the fixed information area, the enabling signal WE for data writing is masked so as not to be transmitted as the control signal. In more detail, as shown in FIG. 2, the read/write controller 202 is so arranged that the detection signal DET transmitted from the address decoder 206 is supplied to an AND gate 300 to mask the enabling signal WE so as not to be transmitted. It is noted that FIG. 2 shows only a control circuit for writing, and as a matter of convenience in explanation omits the portions for readout and erasing.

The address counter 204 comprises counters, the number of which corresponds to the number of bytes of the address signal, and serves as a circuit for latching the address signals loaded in units of byte in synchronism with the bus clocks BCK and transmitting the thus latched signals to the associated ones of the address terminals AT of the main memory unit 10, respectively.

The address decoder 206 serves to read the address signals transmitted from the address counter 204 in units of byte and transmit to the read/write controller 202 the detection signal DET if the addresses are "000000"–"0000FF". In more detail, according to the present embodiment in which the address signal is transmitted with three bytes, the detection signal DET is transmitted in the case when a logical OR of the upper significant 8 bits is "0" a logical OR of the middle significant 8 bits is "0" and a logical OR of the lower significant 8 bits is "0" or "1" and is maintained during a period of time from start-up of the address data identification signal A/D to trailing down thereof.

As the input/output unit or connector 30, according to the present embodiment, there may be used an I/O bus interface having 20 pins introduced in "IC Memory Guideline" (Third Edition), Japan Electronic Industry Development Association (JEIDA). This input/output unit 30 is provided with two ground terminals (GRD), eight data terminals (D0–D7) to which address signals and data signals are supplied, a common power supply terminal to which a common power supply Vcc is supplied, a program power supply terminal to which a program power supply Vpp is supplied in case of writing or erasing, two state terminals, two clock terminals and so on. According to the present embodiment, an address/data identification (A/D) terminal, to which a binary signal for discriminating between the address signal and the data signal is supplied, is assigned to one of the state terminals; a read/write (R/W) terminal, to which a binary signal for discriminating between write-in and read out of the data is supplied, is assigned to the other state terminal; a bus clock terminal (BCK), to which bus clocks synchronized with the address signal and the data signal in units of byte are supplied, is assigned to one of the clock terminals; and a spare terminal, which does not directly relate to write-in and read out of the data, is assigned to the other clock terminal. In FIG. 1, buses at the host side, which are connected with the input/output unit or connector 30, are shown as data bus 400 and control bus 410.

Next, an operation of the above-mentioned IC memory card and a data input/output scheme will be explained hereinafter.

An operator attaches the IC memory card to a host processing apparatus such as an electronic still camera, by means of connecting its input/output unit 30 to the host processing apparatus, and performs a predetermined operation for the host processing apparatus.

Figure 3:
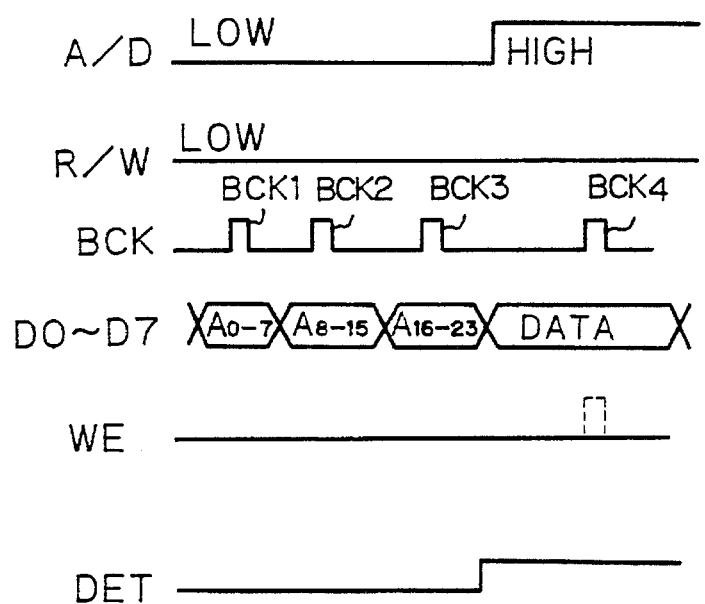
FIG. 3 is a flow chart for explanation of a data input and output scheme in the illustrative embodiment.

First, in the case of the write-in of the data, as shown in FIG. 3, address signals for designating data write-in address are continuously three times transmitted byte by byte from the host side through the data terminals D0–D7 of the input/output unit 30 to the IC memory card. In this case, the address/data identification signal A/D is supplied, as a control signal, with a low level from the host side to a terminal of the input/output unit 30, and further the read/write identification signal R/W is supplied with a low level to a terminal of the input/output unit 30. Those control signals are supplied through the input/output unit 30 to the read/write controller 202, while the address data identification signal A/D is supplied to the bus controller 200. Thus, the read/write controller 202 enters a waiting state for output of the bus clock BCK, and the bus controller 200 determines that the address/data identification signal A/D is indicative of write-in of the address signal, and switches the transmission bus to the address line 500. In this state, if the upper significant eight bits of address signals A0–A7 are supplied from the host side and in addition a first bus clock BCK 1 is supplied, the address counter 204 serves to latch the upper significant eight bits of address signals and transfer them to the main memory unit 10 in synchronism with the first bus clock BCK 1. At that time, the address decoder 206 reads the upper significant eight bits of address signals transmitted from the address counter 204 to perform the logical OR, and determines as to whether or not the logical OR is "0". Next, if the middle significant eight bits of address signals A8–A15 are supplied from the host side and in addition a second bus clock BCK 2 is supplied, the address counter 204 serves to latch the middle significant eight bits of address signals and transfer them to the main memory unit 10 in synchronism with the second bus clock BCK 2. At that time, the address decoder 206 reads the middle significant eight bits of address signals transmitted from the address counter 204 to the main memory unit 10 to perform the logical OR, and determines as to whether or not the logical OR is "0". Subsequently, if the lower significant eight bits of address signals A16–A23 are supplied from the host side and in addition a third bus clock BCK3 is supplied, the address counter 204 serves,. similar to the abovementioned cases, to latch the lower significant eight bits of address signals and transfer them to the main memory unit 10. At that time, similar to the abovementioned cases, the address decoder 206 performs the logical OR for the lower significant eight bits of address signals transmitted from the address counter 204 to the main memory unit 10. As a result, if the addresses to be accessed are "000000"–"0000FF" for the fixed information areas in combination with the previous two bytes of logical OR, the address decoder 206 transmits the detection signal DET to the read/write controller 202, and transmits no detection signal DET when addresses for variable areas other than the fixed information areas are accessed.

Thereafter, a byte of data signals are transmitted from the host side. At that time, a high level of signal is transmitted from the host side to the address/data identification (A/D) terminal. Thus, the bus controller 200 switches the transmission bus to the data line 502 to transmit the data signal supplied to the host side to the data terminal DT of the main memory unit 10. Upon receipt of the bus clock BCK 4 transmitted from the host side, the read/write controller 202 transmits the enabling signal WE for data writing. At that time, if the accessed address is "000000"–"0000FF" for the fixed information areas, the enabling signal WE is masked by the detection signal DERT and then not transmitted, since the detection signal DET has been supplied to an AND gate 300 of the read/write controller 202. Accordingly, there is not performed writing of the data supplied to the main memory unit 10.

When writing of the data is completed, the host processing apparatus causes the address/data identification signal A/D to return to the low level for the next processing. At that time, the address decoder 206 detects the trailing down of the address/data identification signal A/D and stops generation of the detection signal DET.

As stated above, according to the present embodiment, in a case where an access for writing into the fixed information area occurs, the access is detected to mask the enabling signal WE for data writing. Thus, there is no possibility that the storage area for the fixed information will be rewritten with information other than the fixed information, thereby avoiding such a situation that the card becomes unusable.

According to the embodiment stated above, the main memory unit 10 is constituted with an EEPROM. However, it should be apparent that the main memory unit 10 may be constituted with another element such as SRAM.

While the present invention has been described with reference to the particular illustrative embodiment, it is not to be restricted by the embodiment but only by the appended claims. It is to be appreciated that those skilled in the art can change or modify the embodiment without departing from the scope and spirit of the present invention.

What is claimed is:

1. An IC memory card comprising:

storage means having fixed areas for storing control information and variable areas for storing rewritable data;

control means for controlling writing, reading and erasing of data in said storage means; and input/output means removably connectable to host processing means for transferring data between said host processing means and said storage means, said control means comprising bidirectional bus control means, connected to said input/output means, for receiving address signals and data signals from said input/output means and for transferring data signals to a data terminal of said storage means through a switching unit via a first signal line, address counter means, connected to said bidirectional bus control means through said switching unit via a second signal line, said input/output means and an address terminal of said storage means, for latching the address signals received from said bidirectional bus control means, address detecting means, connected to said address terminal, for detecting whether or not the latched address signals correspond to the fixed areas of said storage means and for generating a detection signal when a latched address signal corresponding to the fixed areas is detected, and read/write control means, connected to said input/output means, said address detecting means, and control terminals of said storage means, for masking write, read and erase control signals supplied from said input/output means and directed to said storage means upon receipt of the detection signal generated from said address detection means, so as to inhibit the data from being written into said storage means.

2. The IC memory card according to claim 1, wherein said storage means comprises an EEPROM.

3. The IC memory card according to claim 1, wherein said storage means comprises an SRAM.

4. The IC memory card according to claim 1, wherein the rewritable data comprises image data.

5. The IC memory card according to claim 1, wherein the fixed data comprises control information indicative of storage means type, storage means size, access time and erasing time.

6. A method for masking writing, reading and erasing of data in a storage memory of an IC memory card by a host processor, the storage memory having a fixed storage area for storing fixed data and a variable storage area for storing rewritable data, the IC memory card being detachably coupled to the host processor, the host processor generating write, read and erase control signals and an address signal to direct writing and reading of data in the storage memory, the method of masking comprising the steps of:

latching the address signal supplied from the host processor;

delivering the latched address signal to the storage memory;

generating a detection signal when the latched address signal supplied from the host processor corresponds to an address of the fixed storage area; and masking the write, read and erase control signals supplied from the host processor to inhibit writing, reading and erasing of data in the fixed storage area upon generation of the detection signal.

7. The method of masking according to claim 6, wherein the host processor further generates a clock signal, said steps of latching and delivering occurring in synchronism with the clock signal.

8. The method of masking according to claim 6, wherein the address signal and data supplied from the host processor are separated prior to said step of latching.

* * * * *